(12) United States Patent
Tokuyama et al.

(10) Patent No.: US 10,367,426 B2
(45) Date of Patent: Jul. 30, 2019

(54) POWER CONVERSION DEVICE

(71) Applicant: Hitachi Automotive Systems, Ltd., Hitachinaka-shi, Ibaraki (JP)

(72) Inventors: Takeshi Tokuyama, Hitachinaka (JP); Akira Matsushita, Hitachinaka (JP); Ryuuichi Saitou, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 0 days.

(21) Appl. No.: 15/762,313

(22) PCT Filed: Aug. 2, 2016

(86) PCT No.: PCT/JP2016/072574
§ 371 (c)(1),
(2) Date: Mar. 22, 2018

(87) PCT Pub. No.: WO2017/056686
PCT Pub. Date: Apr. 6, 2017

(65) Prior Publication Data
US 2018/0278172 A1    Sep. 27, 2018

(30) Foreign Application Priority Data

Sep. 30, 2015 (JP) ................................ 2015-192509

(51) Int. Cl.
*H02M 7/00* (2006.01)
*H02M 7/48* (2007.01)
(Continued)

(52) U.S. Cl.
CPC ............ *H02M 7/003* (2013.01); *H01L 23/04* (2013.01); *H01L 23/3121* (2013.01);
(Continued)

(58) Field of Classification Search
CPC ........ H02M 7/003; H02M 7/48; H02M 7/537; H01L 23/04; H01L 23/3121;
(Continued)

(56) References Cited

U.S. PATENT DOCUMENTS

2002/0190060 A1* 12/2002 Imai ...................... H05B 6/145
                                                                  219/619
2006/0125240 A1*  6/2006 Kato ...................... F02N 11/04
                                                                   290/31
(Continued)

FOREIGN PATENT DOCUMENTS

EP    2 487 711 A1    8/2012
JP    11-17083 A      1/1999
(Continued)

OTHER PUBLICATIONS

International Search Report (PCT/ISA/210) issued in PCT Application No. PCT/JP2016/072574 dated Oct. 11, 2016 with English translation (four pages).
(Continued)

*Primary Examiner* — Jue Zhang
*Assistant Examiner* — Kevin H Sprenger
(74) *Attorney, Agent, or Firm* — Crowell & Moring LLP

(57) ABSTRACT

The effect of decreasing the inductance, which cancels the recovery current generated upon the switching operation of the switching element, is enhanced. Provided are a circuit body which has first and second switching elements constituting upper and lower arm circuits and a conductor portions, a metal member, and a relay conductor portion which is arranged to face the metal member with the circuit body interposed therebetween and electrically connected to a terminal connected to any one of conductor portions. An eddy current is induced at the metal member and the relay conductor portion by the recovery current flowing through
(Continued)

the conductor portions according to the switching operation of the first and second switching elements.

6 Claims, 15 Drawing Sheets

(51) Int. Cl.
  *H01L 23/04* (2006.01)
  *H01L 23/31* (2006.01)
  *H01L 23/367* (2006.01)
  *H01L 23/495* (2006.01)
  *H01L 25/07* (2006.01)
  *H01L 25/16* (2006.01)
  *H02M 7/537* (2006.01)

(52) U.S. Cl.
  CPC .... *H01L 23/3675* (2013.01); *H01L 23/49541* (2013.01); *H01L 23/49575* (2013.01); *H01L 25/072* (2013.01); *H01L 25/165* (2013.01); *H02M 7/48* (2013.01); *H02M 7/537* (2013.01); *H01L 2224/40245* (2013.01); *H01L 2924/181* (2013.01)

(58) Field of Classification Search
  CPC .......... H01L 23/3675; H01L 23/49541; H01L 23/49575; H01L 25/072; H01L 25/165
  See application file for complete search history.

(56) References Cited

U.S. PATENT DOCUMENTS

| | | |
|---|---|---|
| 2009/0321924 A1 | 12/2009 | Funakoshi et al. |
| 2011/0051371 A1 | 3/2011 | Azuma et al. |
| 2014/0104759 A1* | 4/2014 | Takano ................ H05K 7/1432 361/637 |
| 2014/0160822 A1 | 6/2014 | Kuwano et al. |

FOREIGN PATENT DOCUMENTS

| | | |
|---|---|---|
| JP | 2010-41838 A | 2/2010 |
| JP | 2012-64609 A | 3/2012 |
| JP | 2013-27218 A | 2/2013 |
| JP | 2013-162690 A | 8/2013 |
| JP | 2014-127538 A | 7/2014 |

OTHER PUBLICATIONS

Japanese-language Written Opinion (PCT/ISA/237) issued in PCT Application No. PCT/JP2016/072574 dated Oct. 11, 2016 (four pages).

Extended European Search Report issued in counterpart European Application No. 16850863.8 dated Apr. 12, 2019 (seven pages).

* cited by examiner

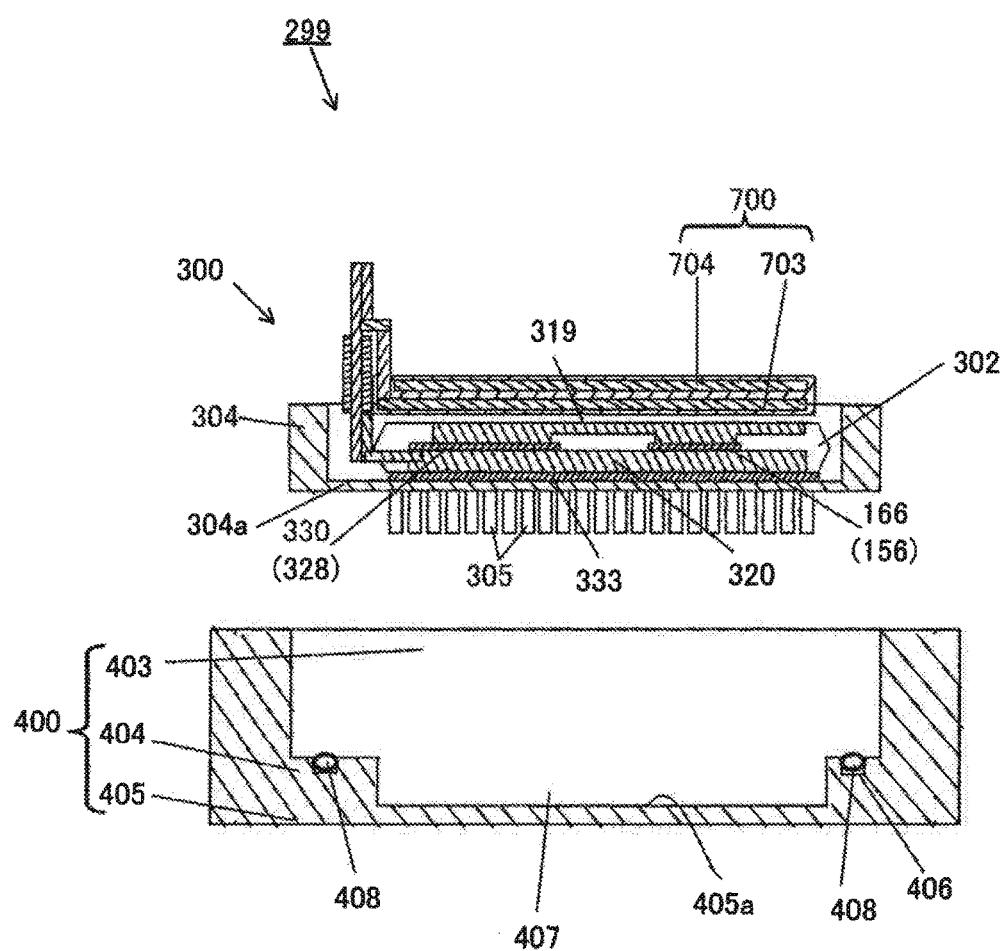

FIG. 14A
FIG. 14B
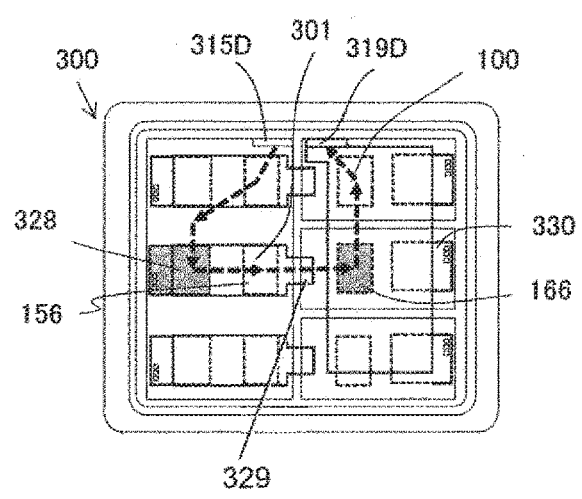
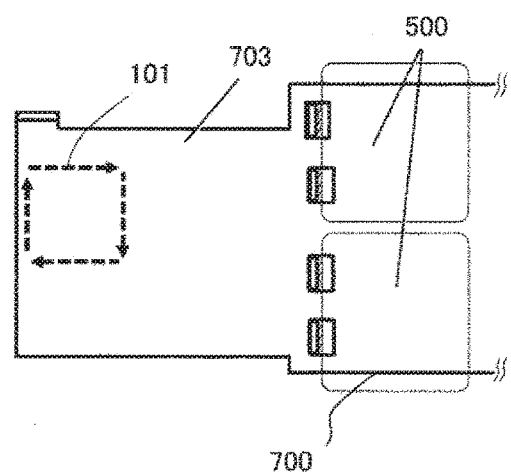

POWER CONVERSION DEVICE

TECHNICAL FIELD

The present invention relates to a power conversion device.

BACKGROUND ART

A power conversion device mounted on a vehicle or the like has functions of converting DC power into AC power and supplying the same to a rotating electrical machine and converting AC power from the rotating electrical machine into DC power. The power conversion device has an inverter circuit constituted by a semiconductor element having a switching function. As a circuit body performing power conversion, that is, a power semiconductor module, one with a structure formed by resin-sealing an upper arm circuit and a lower arm circuit, which are constituted by insulating gate bipolar transistors (IGBTs) and diodes, integrally has been known. In a circuit body with this structure, each of the IGBTs and the diodes of the upper and lower arm circuits is mounted on one face of an insulating board. A metal base is arranged on the other face of a pair of insulating boards on which the upper arm circuit or the lower arm circuit is formed.

The connection conductors connected to the IGBTs and the IGBTs of the upper and lower arm circuits are mounted so as to form a loop current path on the metal base. In this circuit, when the IGBTs of the upper arm circuit are turned on, the diodes of the lower arm circuit are reverse biased so that the recovery current passes through the upper and lower arm circuits. At this time, an induced current is generated at the metal base. The direction of the magnetic flux generated around this induced current is opposite to the direction of the magnetic flux generated by the recovery current flowing through each conductor plate of the upper and lower arm circuits. Thus, the magnetic fluxes cancel each other, and an inductance of an internal circuit decreases (e.g., see FIG. 9 of PTL 1).

CITATION LIST

Patent Literature

PTL 1: JP 2010-41838 A

SUMMARY OF INVENTION

Technical Problem

In a power conversion device described in PTL 1, a metal member is arranged only on the outer face of one of each insulating board on which the upper arm circuit or the lower arm circuit is mounted. Therefore, the effect of decreasing the inductance with respect to the recovery current is small.

Solution to Problems

According to one aspect of the present invention, a power conversion device includes: a circuit body comprising: a first switching element which constitutes an upper arm circuit of a power conversion circuit; a second switching element which constitutes a lower arm circuit of the power conversion circuit; and a plurality of conductor portions which transmits an electric current to the first switching element and the second switching element; a metal member; a relay conductor plate which is arranged to face the metal member with the circuit body interposed therebetween and is electrically connected a terminal connected to any one of the conductor portions, in which an eddy current is induced at the metal member and the relay conductor plate by a recovery current flowing through the conductor portions according to switching operation of the first switching element or the second switching element.

Advantageous Effects of Invention

According to the present invention, the effect of decreasing the inductance with respect to the recovery current can be enhanced.

BRIEF DESCRIPTION OF DRAWINGS

FIG. 8 is a cross-sectional view along the line VIII-VIII in FIG. 1, showing one example of a cooling structure of the power conversion device according to the present invention.

FIG. 14A shows a current path of the power module shown in FIG. 13, and FIG. 14B shows a current path of the relay conductor portion shown in FIG. 13.

DESCRIPTION OF EMBODIMENTS

Embodiment 1

Hereinafter, Embodiment 1 of a power conversion device of the present invention will be described with reference to FIGS. 1 to 8. The power conversion device is used for vehicles such as hybrid automobiles and electric automobile, for trains, ships or aircraft, or further for industrial applications such as factory facilities. The power conversion device incorporates an inverter circuit, converts DC power into AC power, and supplies the same to the rotating electrical machine. Moreover, AC power from the rotating electrical machine is converted into DC power. A power conversion circuit incorporates a capacitor module. The capacitor module constitutes a smoothing circuit which suppresses the fluctuation of the DC, voltage caused by the switching operation of IGBTs of the power conversion device. The inverter circuit includes a plurality of, for example, three power semiconductor modules, and each power semiconductor module is connected so as to constitute a three-phase bridge circuit.

Figure 1:
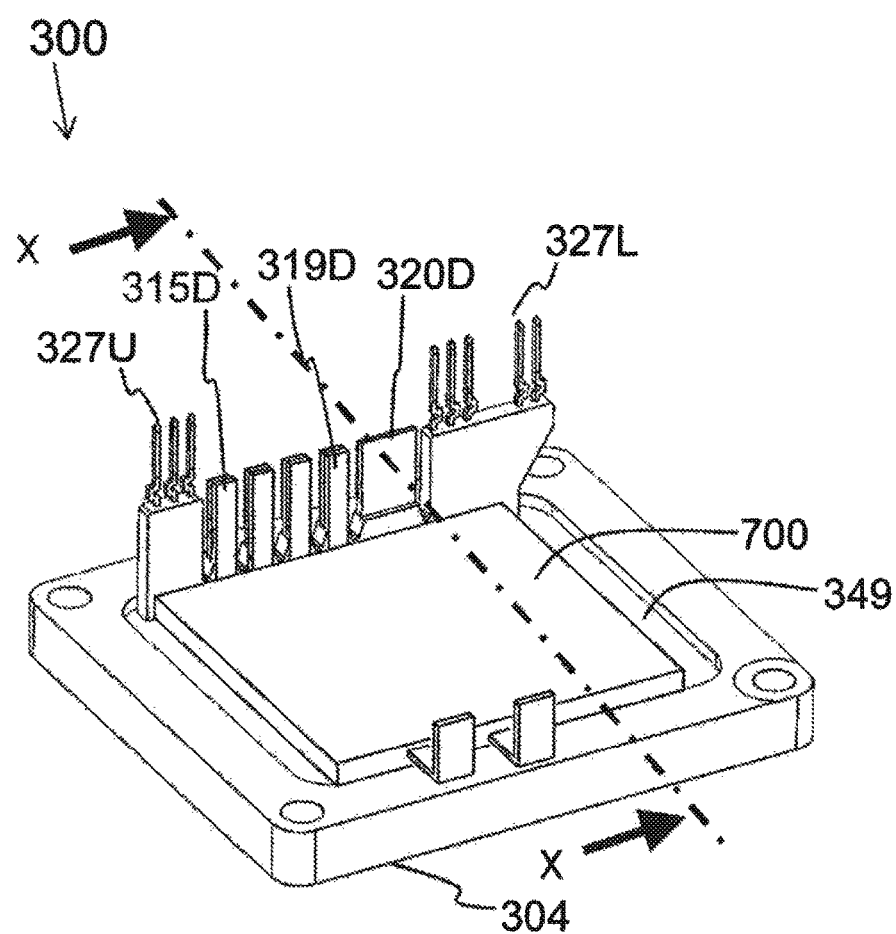
FIG. 1 is a perspective view of Embodiment 1 of a power conversion device according to the present invention.
Figure 2:
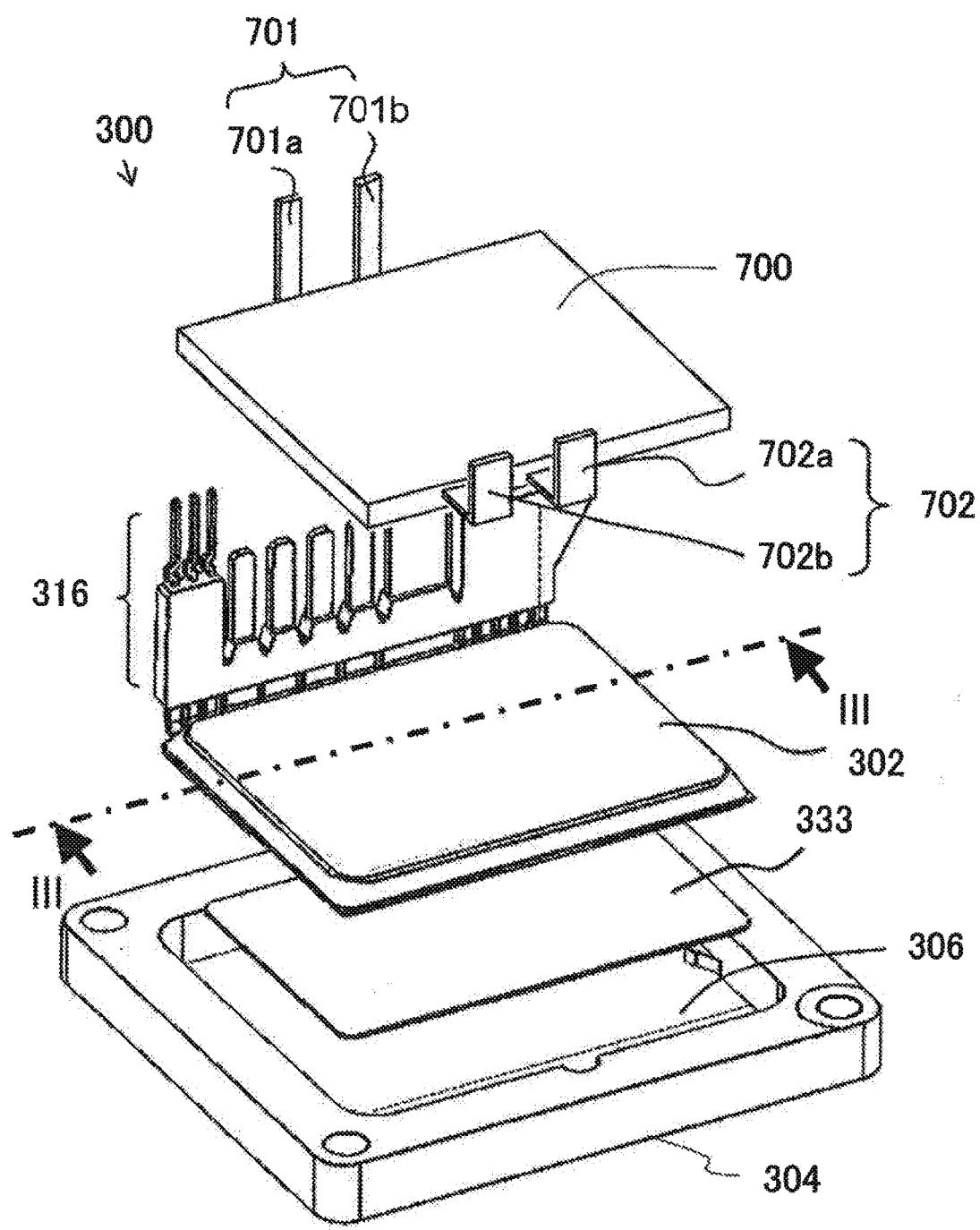
FIG. 2 is an exploded perspective view of the power conversion device shown in FIG. 1.
Figure 3:
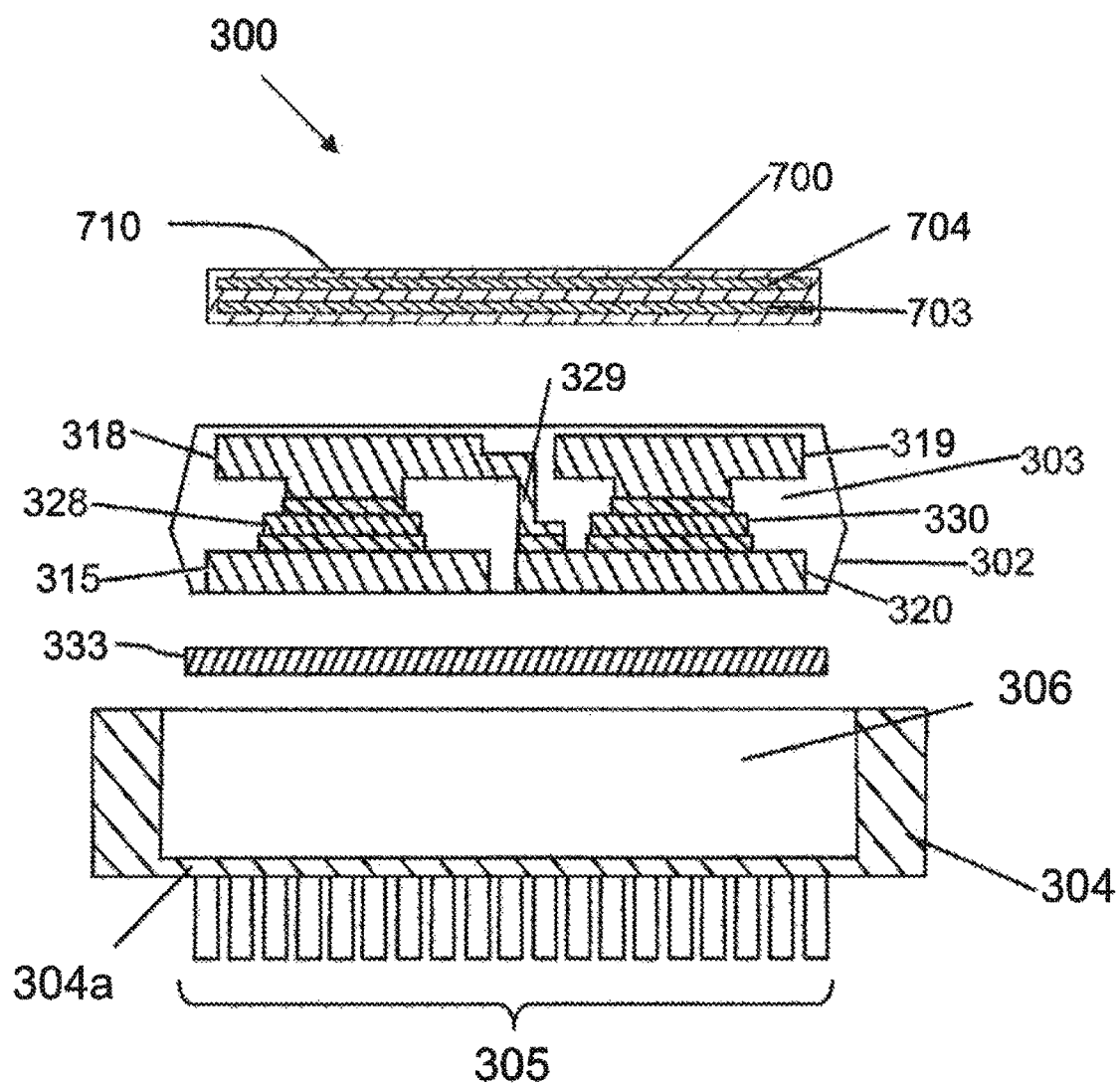
FIG. 3 is a cross-sectional view taken along the line III-III in FIG. 2.
Figure 4:
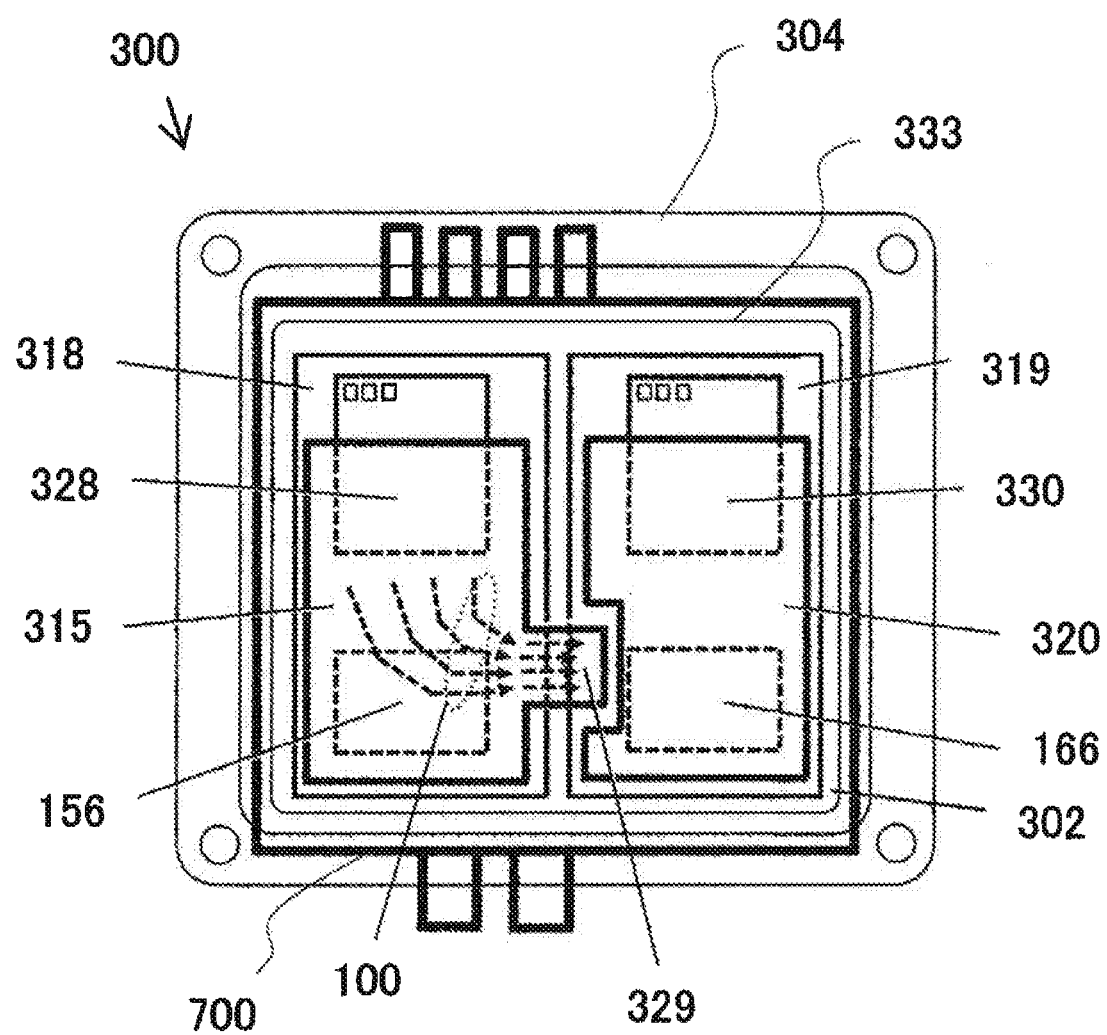
FIG. 4 is a plan view of FIG. 1 as seen from the top through a relay conductor portion.

FIG. 1 is a perspective view of Embodiment 1 of the power conversion devices according to the present invention, and FIG. 2 is an exploded perspective view of the power conversion device shown in FIG. 1. FIG. 3 is a cross-sectional view along the line III-III in FIG. 2. FIG. 4 is a plan view as seen from the top in FIG. 1 through a relay conductor portion 700. A power conversion device 300 shown as Embodiment 1 includes one circuit body 302, that is, power semiconductor module.

The power module, that is, the power conversion device 300 includes a case 304, a circuit body 302 and the relay conductor portion 700. The case 304, the circuit body 302 and the relay conductor portion 700 are arranged in a horizontal state and are stacked in this order. The case 304 has a thin rectangular parallelepiped shape, and an accommodation portion 306 which accommodates the circuit body 302 is formed on the upper side. As shown in FIG. 3, a plurality of heat dissipation fins 305 protruding outward are formed on at a bottom portion 304a of the case 304. The case 304 and the fins 305 can be made of a metal with good electrical conductivity, for example, Cu or Cu alloy, a composite material such as Cu—C or Cu—CUO or a composite material such as Al, Al Si, AlSiC or Al—C. The fins 305 may be integrally made of the same material as the case 304 or may be made of a different material from the case 304.

Figure 5:
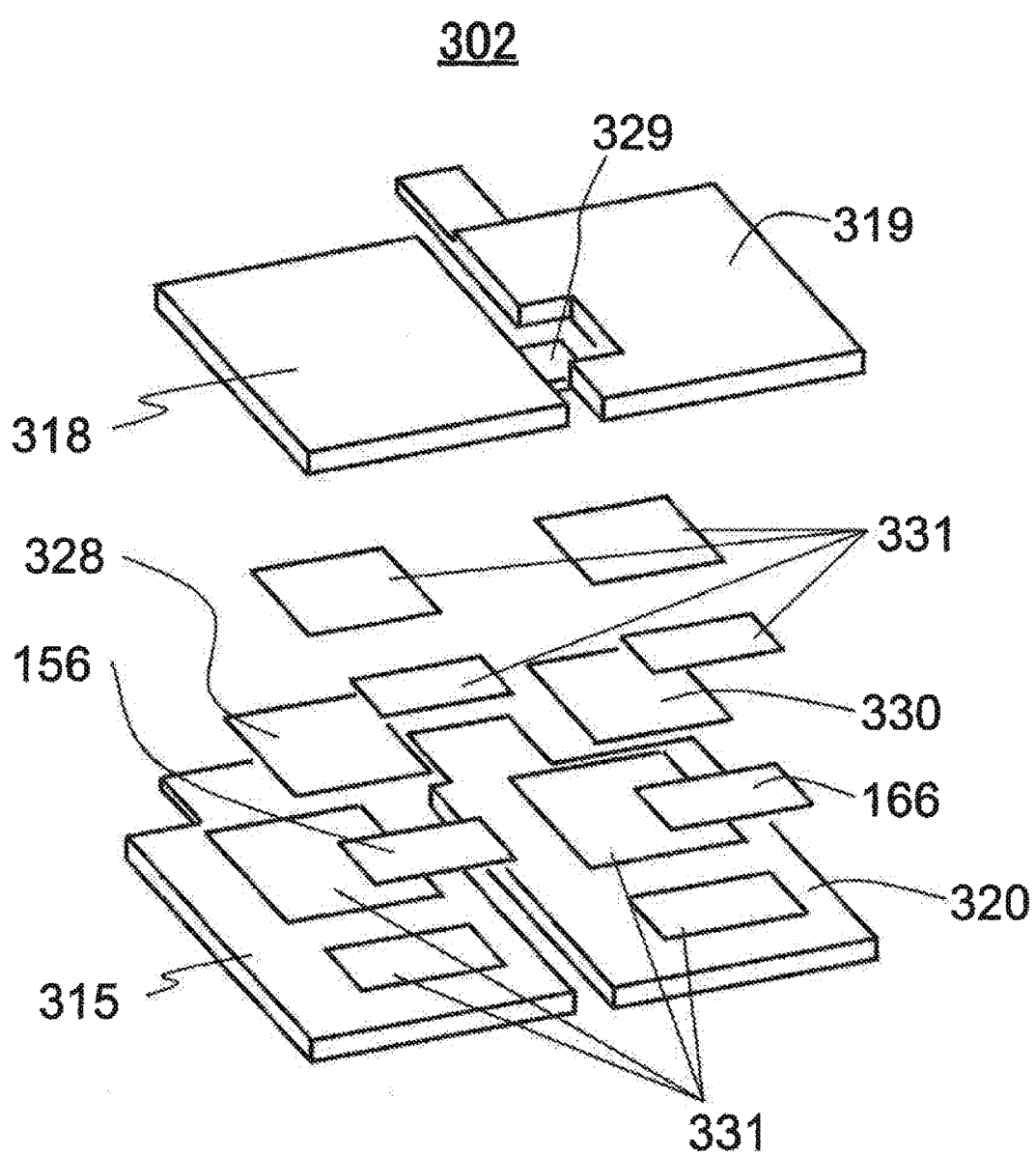
FIG. 5 is an exploded perspective view of the circuit body shown in FIG. 2.
Figure 6:
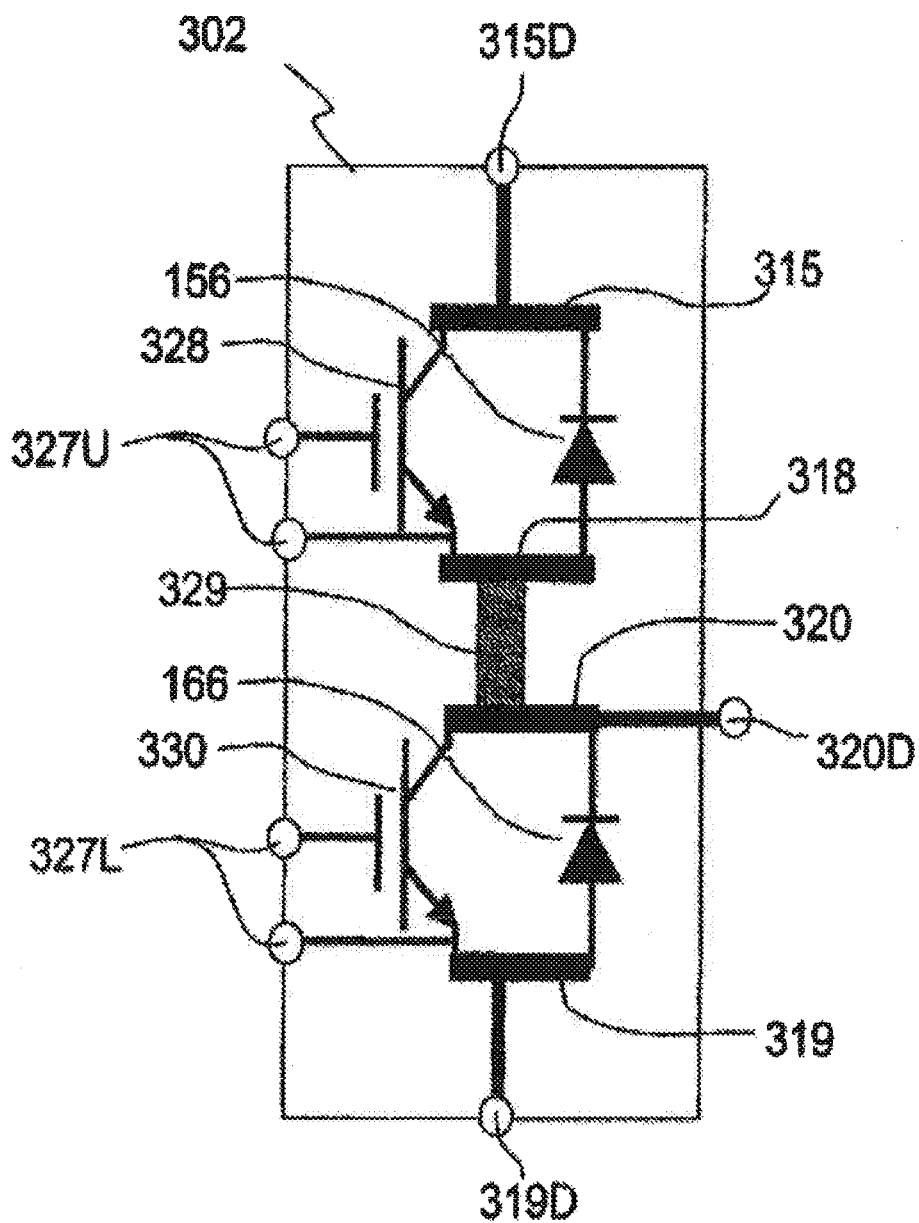
FIG. 6 is a circuit diagram showing one example of a circuit of the power conversion device of the present invention.

FIG. 5 is an exploded perspective view of the circuit body 302. The circuit body 302 has a thin rectangular parallelepiped shape in which members constituting upper and lower arm circuits shown in FIG. 6 are sealed with a sealing resin 303 (see FIG. 3). The circuit body 302 shown in FIGS. 3 and 5 will be described in relation to the circuit diagram shown in FIG. 6. A positive DC conductor plate 315 and a first AC conductor plate 320 are arranged in substantially the same plane. A collector electrode formed at one face of an IGBT 328 of the upper arm circuit and a cathode electrode formed at one face of a diode 156 of the upper arm circuit are fixed to the positive DC conductor plate 315 through metal bonding members 331 such as solder. A collector electrode of an IGBT 330 of the lower arm circuit and a cathode electrode of a diode 166 of the lower arm circuit are fixed to the first AC conductor plate 320 through the metal bonding members 331 such as solder. As the metal bonding members 331, for example, soft wax members (solder) such as a Sn alloy, hard wax members such as an Al alloy/Cu alloy, or metal sintered members using metal nano particles or micro particles can be used.

A second AC conductor plate 318 and a negative DC conductor plate 319 are arranged in substantially the same plane. An emitter electrode of the IGBT 328 of the upper arm circuit and an anode electrode of the diode 156 of the upper arm circuit are fixed to the second AC conductor plate 318 through the metal bonding members 331 such as solder. An emitter electrode of the IGBT 330 of the lower arm circuit and an anode electrode of the diode 166 of the lower arm circuit are fixed to the negative DC conductor plate 319 through the metal bonding members 331 such as solder.

Power semiconductor elements such as the IGBTs 328 and 330 and the diodes 156 and 166 are fixed to element fixing portions provided at the respective conductor plates described above. Each power semiconductor element has a placoid flat structure, and each electrode is formed at the front and back faces. As shown in FIG. 3, the positive DC conductor plate 315 and the second AC conductor plate 318 are arranged substantially parallel in a horizontal state with the IGBT 328 and the diode 156 interposed therebetween. The first AC conductor plate 320 and the negative DC conductor plate 319 are arranged substantially parallel in a horizontal state with the IGBT 330 and the diode 166 interposed therebetween. The first AC conductor plate 320 and the second AC conductor plate 318 are connected by an intermediate connection portion 329 (see FIGS. 3 to 6). By this connection, the upper arm circuit and the lower arm circuit are electrically connected, and an upper and lower arm series circuit is formed.

A positive DC terminal 315D is integrally formed with the positive DC conductor plate 315. A negative DC terminal 319D is integrally formed with the negative DC conductor plate 319. External signal terminals 327U are connected to a gate electrode and the emitter electrode of the IGBT 328. External signal terminals 327I, are connected to a gate electrode and the emitter electrode of the IGBT 330.

The positive/negative DC conductor plates 315 and 319, the first and second AC conductor plates 320 and 318, the positive/negative DC terminals 315D and 319D and the external signal terminals 327U and 327L are integrally formed by insert molding with the sealing resin 303. As shown in FIG. 3, each of the outer surfaces of the positive DC conductor plate 313 and the first AC conductor plate 320 is flush with the outer surface of the sealing resin 303 and is exposed from the sealing resin 303. Moreover, the upper surfaces of the negative DC conductor plate 319 and the second AC conductor plate 318 are flush with each other and covered with the sealing resin 303. However, the upper surfaces of the negative DC conductor plate 319 and the second AC conductor plate 318 may also be exposed from the sealing resin 303.

Note that an AC terminal 320D is connected to the first AC conductor plate 320 which is a connection portion between the upper arm circuit and the lower arm circuit of the upper and lower arm series circuit. Although not shown, the AC terminal 320D is connected to an AC output terminal through an AC bus bar, and the generated AC power is supplied to a stator winding of a motor generator.

As the sealing resin 303 of the circuit body 302, for example, a resin based on novolac based, polyfunctional based, or biphenyl based epoxy resin can be used. When ceramics such as $SiO_2$, $Al_2O_3$, AlN or BN, gel, rubber or the like are contained in the resin, the thermal expansion coefficients can be brought closer to the conductor portion. By decreasing the differences between the members in terms of the thermal expansion coefficients, the thermal stress generated as the temperature rises in the use environment is reduced. Thus, it is possible to extend the life of the circuit body 302, that is, the power semiconductor module. Note that the positive/negative DC conductor plates 315 and 319, and the first and second. AC conductor plates 320 and 318 are simply hereinafter referred to as conductor plates 315, 319, 320 and 312, respectively.

As shown in FIG. 3, the circuit body 302 is thermally coupled to the bottom portion 304a of the case 304 by an insulating sheet 333 with good thermal conductivity. In this state, the outer surfaces of the positive DC conductor plate 315 and the first AC conductor plate 320 constituting the circuit body 302 are in close contact with the bottom portion 304a of the case 304 through the insulating sheet 333. The conductor plates 315, 316, 319 and 320 of the circuit body 302 are arranged in a substantially horizontal state together with the bottom portion 304a of the case 304. Thus, the cooling effect of the circuit body 302 becomes good. Moreover, it is possible to shorten the height of the power conversion device 300.

Although not shown, the positive/negative DC terminals 315D and 319D, the external signal terminals 327U and 327L and the AC terminal 320D are insert-molded into an auxiliary mold member and connected to the conductor plate 315, the conductor plate 319, the IGBT 328, the IGBT 330 and the conductor plate 320, respectively, through connection members such as reeds. Then, the circuit body 302 is accommodated in the accommodation portion 306 of the case 304, and the case 304 is filled with an external sealing resin 349 as shown in FIG. 1.

As shown in FIG. 4, the relay conductor portion 700 has a rectangular shape slightly larger than the circuit body 302. The relay conductor portion 700 is arranged above the circuit body 302. The power conversion device 300 may have a structure in which the relay conductor portion 700 is accommodated in the accommodation portion 306 of the case 304 or may have a structure in which the relay conductor portion 700 is arranged outside from the upper face of the accommodation portion 306 of the case 304.

As shown in FIG. 3, the relay conductor portion 700 is formed by insert-molding the positive side bus bar 703 and the negative side bus bar 704 into a sealing resin 710. A positive side bus bar 703 and a negative side bus bar 704 are arranged to be spaced apart from each other in the thickness direction of the sealing resin 710 and insulated from each other. In the illustrated example, the positive side bus bar 703 is arranged so as to face the circuit body 302, and the negative side bus bar 704 is arranged to face the face opposite to the circuit body 302.

Both of the positive/negative side bus bars 703 and 704 of the relay conductor portion 700 have sizes which cover rectangular regions formed by outer peripheral side faces of the conductor plates 318 and 319 and rectangular regions formed by outer peripheral side faces of the conductor plates 315 and 320. However, in the structure shown in the drawing where the negative side bus bar 704 is arranged on the side opposite to the circuit body 302, the negative side bus bar 704 may have a smaller area than the positive side bus bar 703.

Figure 7A:
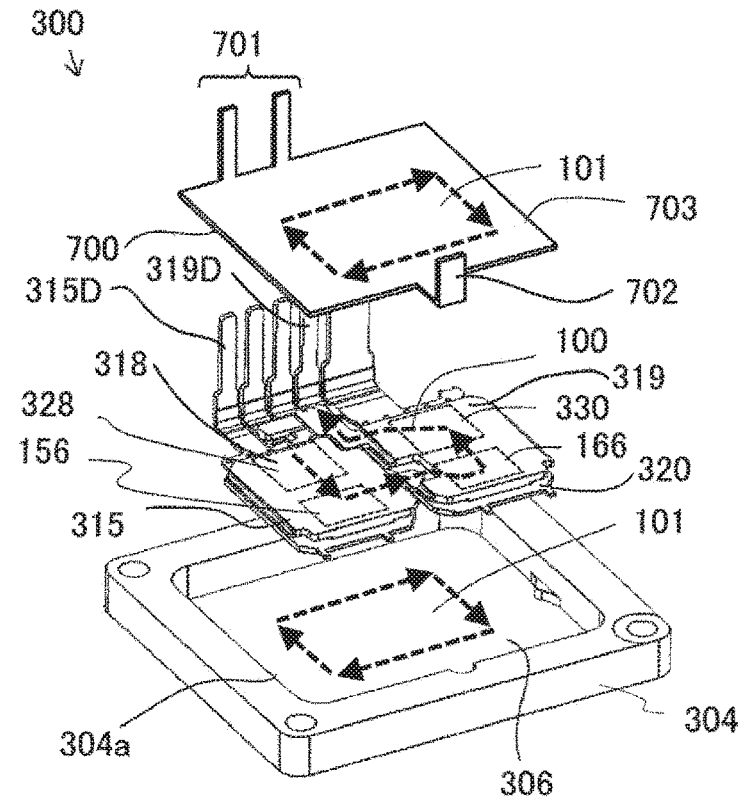
FIGS. 7A and 7B are diagrams showing current paths of the power conversion device of the present invention.
Figure 7B:
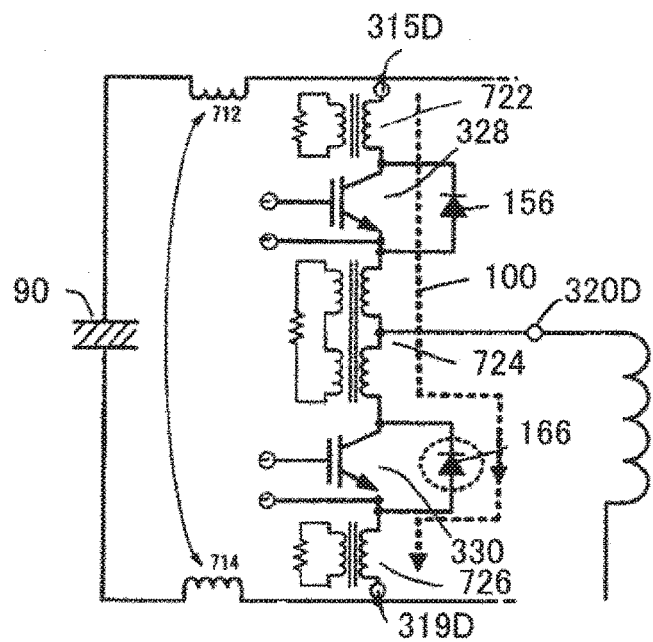

As shown in FIGS. 2 and 4, the positive/negative side bus bars 703 and 704 have module connection terminals 701 connected to the circuit body 302 and capacitor connection terminals 702 connected to a capacitor 90 (see FIG. 7(B)).

The capacitor 90 is a capacitor for smoothing a voltage. The module connection terminals 701 and the capacitor connection terminals 702 are led out to the outside of the sealing resin 710. A module connection terminal 701a of the positive side bus bar 703 is connected to the positive DC terminal 315D, and a capacitor connection terminal 702a of the positive side bus bar 703 is connected to a positive side terminal of the capacitor 90. A module connection terminal 701b of the negative side bus bar 704 is connected to the negative DC terminal 319D, and a capacitor connection terminal 702b of the negative side bus bar 704 is connected to a negative side terminal of the capacitor 90.

FIGS. 7(A) and 7(B) show current paths of the power conversion device 300 in the present embodiment. The effect of decreasing the inductance by the power conversion device of the present invention will be described with reference to FIGS. 7(A) and 7(B). The surge voltage and the heat generation of the power semiconductor elements are generated during the switching operation of the upper arm circuit or the lower arm circuit constituting the inverter circuit. Therefore, in particular, it is desirable to decrease the inductance during the switching operation. Since a recovery current 100 of the diode is generated during the transient period immediately after the switching, the action of decreasing the inductance will be described by taking this recovery current 100 as an example. The recovery current of the diode is a current flowing through the diode despite being a reverse bias. That is, the recovery current is generated due to the carriers filled in the diode in a forward direction state of the diode.

When the IGBT 328 operating as the upper arm circuit is switched from a conduction state to a disconnection state, a return current flows through the diode 166 of the lower arm circuit in the direction of maintaining the current of the stator winding of the motor generator. Next, when the IGBT 328 operating as the upper arm circuit is switched from the disconnection state to the conduction state again, the aforementioned recovery current 100 caused by the carriers flows through the diode 166 of the lower arm circuit. In steady operation, either of the upper or lower arm series circuits is necessarily in the disconnection state, and no short circuit current flows in the upper and lower arm circuits. On the other hand, the current in a transient state, for example, the recovery current 100 of the diode 166 flows through the series circuit constituted by the upper and lower arm circuits as shown in FIG. 7(B).

The recovery current 100 flows through the negative DC terminal 319D and the positive DC terminal 315D arranged in parallel close to the negative DC terminal 319D. The direction of the current flowing through the negative DC terminal. 319D and the positive DC terminal 315D is in the opposite directions since the negative DC terminal 319D and the positive DC terminal 315D are arranged in parallel in the same direction (see FIG. 1). The recovery current 100 flows between the negative DC terminal 319D via the conductor plates 315, 318, 320 and 319. The conductor plates 315, 318, 320 and 319 form a loop-shaped path. An induced current is generated at the bottom portion 304a of the case 304 as a result of the flow of the recovery current 100 through this loop-shaped path, and an eddy current 101 flows as shown in FIG. 7(B). Moreover, as shown in FIG. 7(A), the eddy current 101 also flows through the positive side bus bar 703 of the relay conductor portion 700. Note that the negative side bus bar 704 is omitted in FIG. 7(A). The direction of the magnetic flux generated around this eddy current 101 and the direction of the magnetic flux generated by the recovery current 100 flowing through the conductor plates 315, 318, 320 and 319 of the upper and lower arm circuits forming a loop-shaped path are opposite to each other. Therefore, the magnetic fluxes cancel each other, and the inductance of the internal circuit of the circuit body 302 decreases. In FIG. 7(B), the phenomena that the eddy current 101 occurs are equivalently shown as inductances 722, 724 and 726.

As described above, in the power conversion device 300 of Embodiment 1, the loop-shaped path formed by the conductor plates 315, 318, 320 and 319 of the upper and lower arm circuits is constituted between the bottom portion 304a of the case 304 and the positive side bus bar 703 of the relay conductor portion 700. Thus, the recovery current 100 flowing through the upper and lower arm circuits can be canceled by the eddy currents 101 induced at the bottom portion 304a of the case 304 and the positive side bus bar 703 of the relay conductor portion 700, which are arranged on the upper and lower faces of the upper and lower arm circuits. Therefore, the effect of decreasing the inductance of the internal circuit of the circuit body 302 can be enhanced.

FIG. 8 is a cross-sectional view, along the line VIII-VIII in FIG. 1, showing one example of a water-cooled power conversion device 299 according to the present invention.

The water-cooled power conversion device 299 includes the power conversion device 300, that is, a power module, and a cooling housing 400.

The cooling housing 400 is made of a metal member similar to the case 304. In the cooling housing 400, an accommodation portion 403 in which the power conversion device 300 is accommodated, a bottom portion 405, and a step portion 404 provided between the accommodation portion 403 and the bottom portion 405 are formed. The step portion 404 holds the peripheral portion of the bottom portion 304a of the case 304. In the step portion 404, a groove 406 formed in an annular shape is formed. An O-ring 408 is fitted into the groove 406. The power conversion device 300 is fixed onto the step portion 404 of the cooling housing 400 in a state where the O-ring 408 is compressed. The length from an inner face 405a of the bottom portion 405 of the cooling housing 400 to the step portion 404 is slightly longer than the lengths of the fins 305. That is, a space between the inner face 405a of the bottom portion 405 and the step portion 404 is defined as a cooling flow path 407, and a coolant such as cooling water flows in the cooling flow path 407 around the fins 305 and gaps between the fins 305. Thus, the IGBTs 328 and 330 and the diodes 156 and 166 incorporated in the circuit body 302 are cooled.

According to Embodiment 1, the following effects are exerted.

(1) The positive DC terminal 315D and the negative DC terminal 319D constituting the circuit body 302 were arranged close to each other in parallel. Moreover, the conductor plates 315, 318, 320 and 319 of the upper and lower arm circuits were arranged so as to form the loop-shaped path. Thus, the recovery current 100 flowing through the upper and lower arm circuits flows through the loop-shaped path. This circuit body 302 was arranged on the bottom portion 304a of the metal case 304, and the relay conductor portion 700 was arranged on the circuit body 302. Therefore, the recovery current 100 flowing through the upper and lower arm circuits of the circuit body 302 can be canceled by the eddy currents 101 induced at the case 304 and the relay conductor portion 700, which arranged on the upper and lower faces of the circuit body 302. Since the recovery current 100 is canceled from the upper and lower faces of the upper and lower arm circuits, the effect of decreasing the inductance of the internal circuit of the circuit body 302 can be enhanced.

(2) The size of the positive side bus bar 703 of the relay conductor portion 700 where the eddy current 101 is induced was set to the size which covers the entirety of the conductor plates 318, 315, 319 and 320. Moreover, the intermediate connection portion 329 connecting the first AC conductor plate 320 and the second AC conductor plate 318 is covered with the positive side bus bar 703. As shown in FIG. 4, the first AC conductor plate 320 and the second AC conductor plate 318 are connected only by the intermediate connection portion 329. Thus, the recovery current 100 flowing through the conductor plates 318 and 315 concentrates and flows through the intermediate connection portion 329. Accordingly, the inductance is in a high state in the vicinity of the intermediate connection portion 329. Therefore, by covering the upper and lower faces of the intermediate connection portion 329 with the case 304 and the relay conductor portion 700 and obtaining a magnetic field cancellation effect by the eddy current 101 also in the vicinity of the relay conductor portion 700 of the circuit body 302, the effect of decreasing the inductance of the internal circuit of the circuit body 302 can be further enhanced.

(3) The positive side bus bar 703 connecting the circuit body 302 and the capacitor 90 had a structure that also serves the function of decreasing the inductance of the internal circuit of the circuit body 302. Therefore, it is possible to make the inexpensive and thin power conversion device 300 with less number of parts and good productivity.

(4) The conductor plates 315, 318, 319 and 320 of the circuit body 302 are arranged. In a substantially horizontal state together with the bottom portion 304a of the case 304. Therefore, the height of the circuit body 302 is shortened, and the height of the power conversion device 300, a power module, can be shortened.

Figure 10:
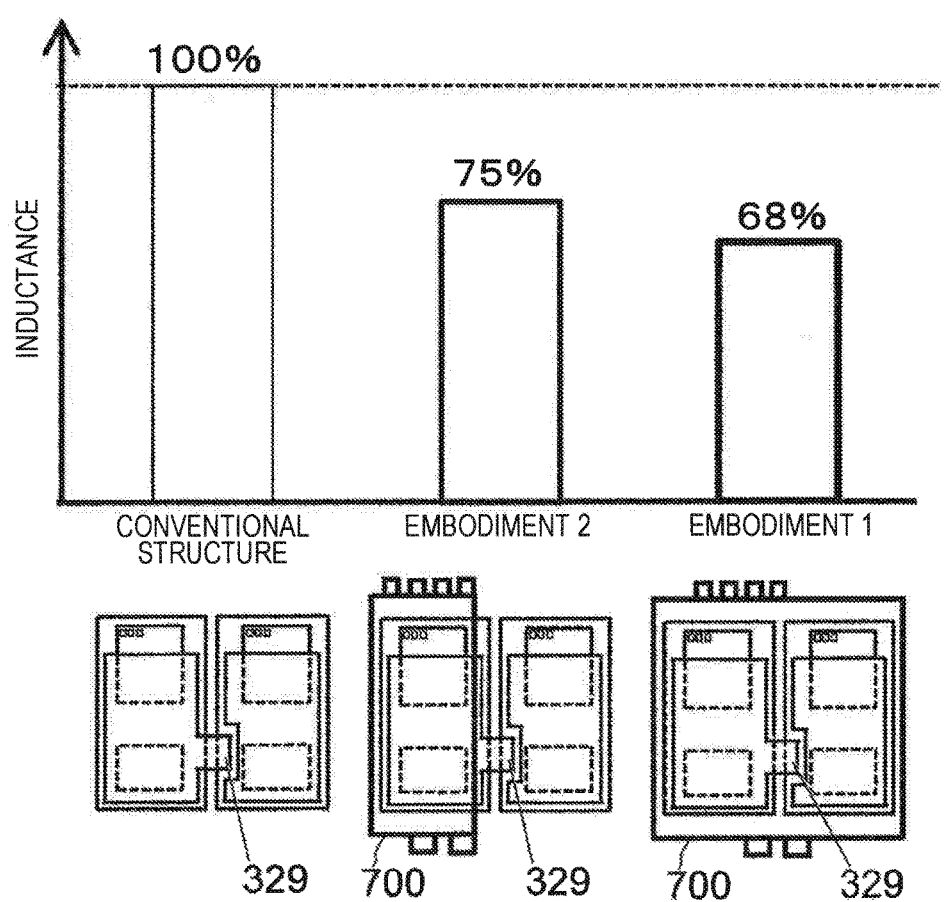
FIG. 10 is a graph showing the effect of decreasing the inductance according to the present invention.

(5) As shown in FIG. 10, the cooling housing 400 accommodating the power module 300 has the bottom portion 405 thereof formed parallel to the bottom portion 304a of the case 304 accommodating the conductor plates 315, 318, 319 and 320. Therefore, it is possible to shorten the height of the power conversion device 299 with the structure having the cooling housing 400 which cools the power module 300 with a coolant such as cooling water.

Embodiment 2

Figure 9A:
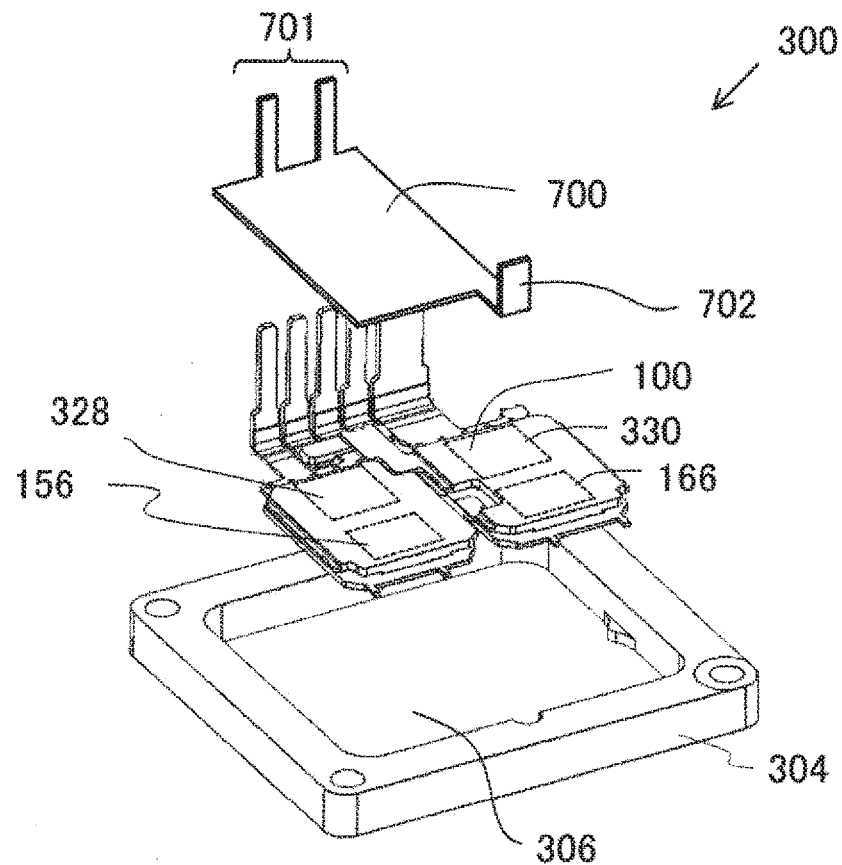
FIG. 9A is an exploded perspective view of Embodiment 2 of the power conversion device according to the present invention.

FIG. 9(A) is an exploded perspective view of Embodiment 2 of the power conversion device 300 according to the present invention, and FIG. 9(E) is a plan view as seen from top of the power conversion device shown in FIG. 9(A) through the relay conductor portion 700. In Embodiment 2, the relay conductor portion 700 has a structure in which the relay conductor portion 700 covers only the conductor plates 315 and 318 which sandwich the IGBT 328 and a diode 156 constituting t upper arm circuit. In other words, in the power conversion device of Embodiment 2, the conductor plates 320 and 319, which sandwich the IGBT 330 and the diode 166 constituting the lower arm circuit, and the intermediate connection portion 329 are exposed from the relay conductor portion 700. Other constituents in Embodiment 2 are similar to those in Embodiment 1 so that the same reference signs are given to the corresponding members, and the descriptions thereof are omitted.

In Embodiment 2, similarly to Embodiment 1, the recovery current flowing through the upper and lower arm circuits is canceled by the eddy current 101 induced near the case 304 at the bottom portion 304a, and the inductance is decreased. On the other hand, near the relay conductor portion 700, the recovery current 100 flowing through the conductor plates 315 and 318 sandwiching the IGBT 328 and the diode 156 of the upper arm circuit is canceled by the eddy current 101 induced by the relay conductor portion 700, and the inductance is decreased. Therefore, the effect of decreasing the inductance can be enhanced as compared with a structure which does not have the canceling action of the recovery current 100 near the relay conductor portion 700. Therefore, the effects similar to the effects (1) to (5) of Embodiment 1 are exerted.

Figure 9B:
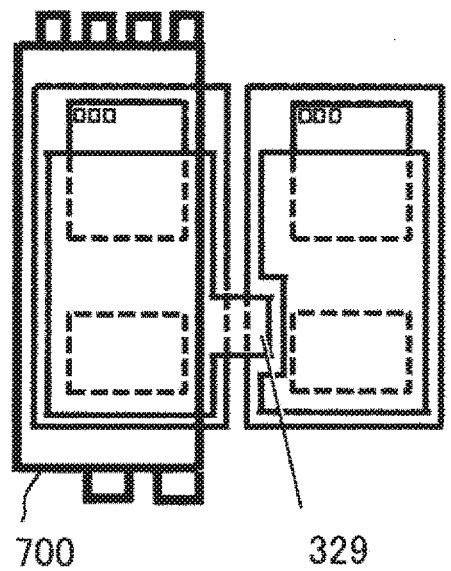
FIG. 9B is a plan view as seen from top of the power conversion device shown in FIG. 9A through a relay conductor portion.

The effect of decreasing the inductance according to the present invention will be described in comparison with a conventional structure with reference to FIG. 10. A structure of the power conversion device in which the relay conductor portion 700 of the present invention is not arranged above the circuit body 302 is defined as a conventional structure. FIG. 9 shows the results of comparing the inductance occurred in the internal circuit of the circuit body 302 between the conventional structure and the power conversion devices 300 of Embodiments 1 and 2. In the power conversion device 300 of Embodiment 2 which covers only the conductor plates 315 and 318 that sandwich the IGBT 328 and the diode 156 with the relay conductor portion 700, the inductance was decreased to 75% of the conventional structure. Moreover, in the power conversion device 300 of Embodiment 1 in which the conductor plates 315 and 318 and the conductor plates 320 and 319 of the upper and lower arm circuits and the intermediate connection portion 329 are covered with the relay conductor portion 700, the inductance was reduced to 68% of the conventional structure. Thus, it has been confirmed that, in both of Embodiments 1 and 2, there is an effect of decreasing the inductance occurred in the circuit body 302, that is, the power semiconductor module, compared with the conventional structure.

Embodiment 3

Figure 11:
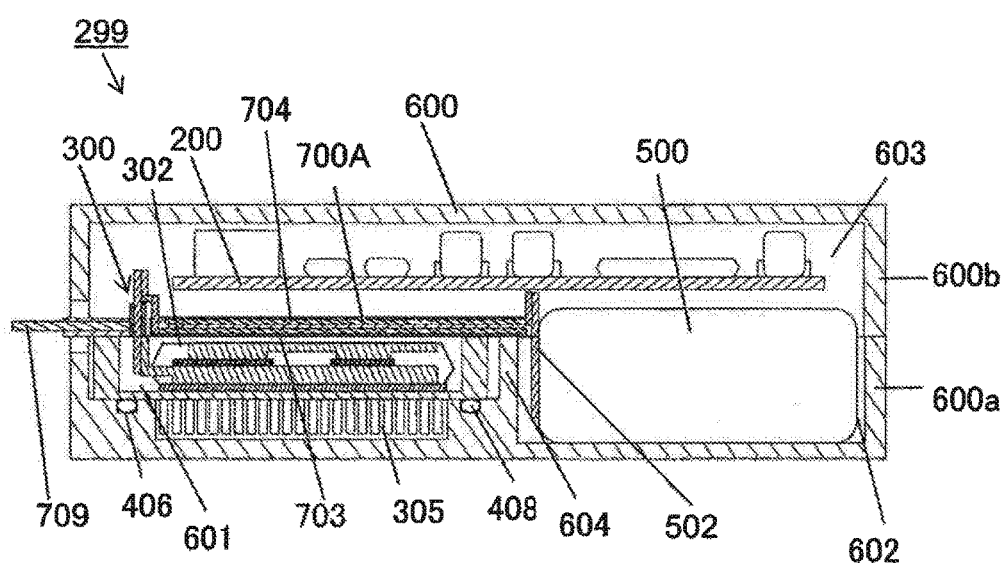
FIG. 11 is a cross-sectional view of Embodiment 3 of the power conversion device according to the present invention.
Figure 12:
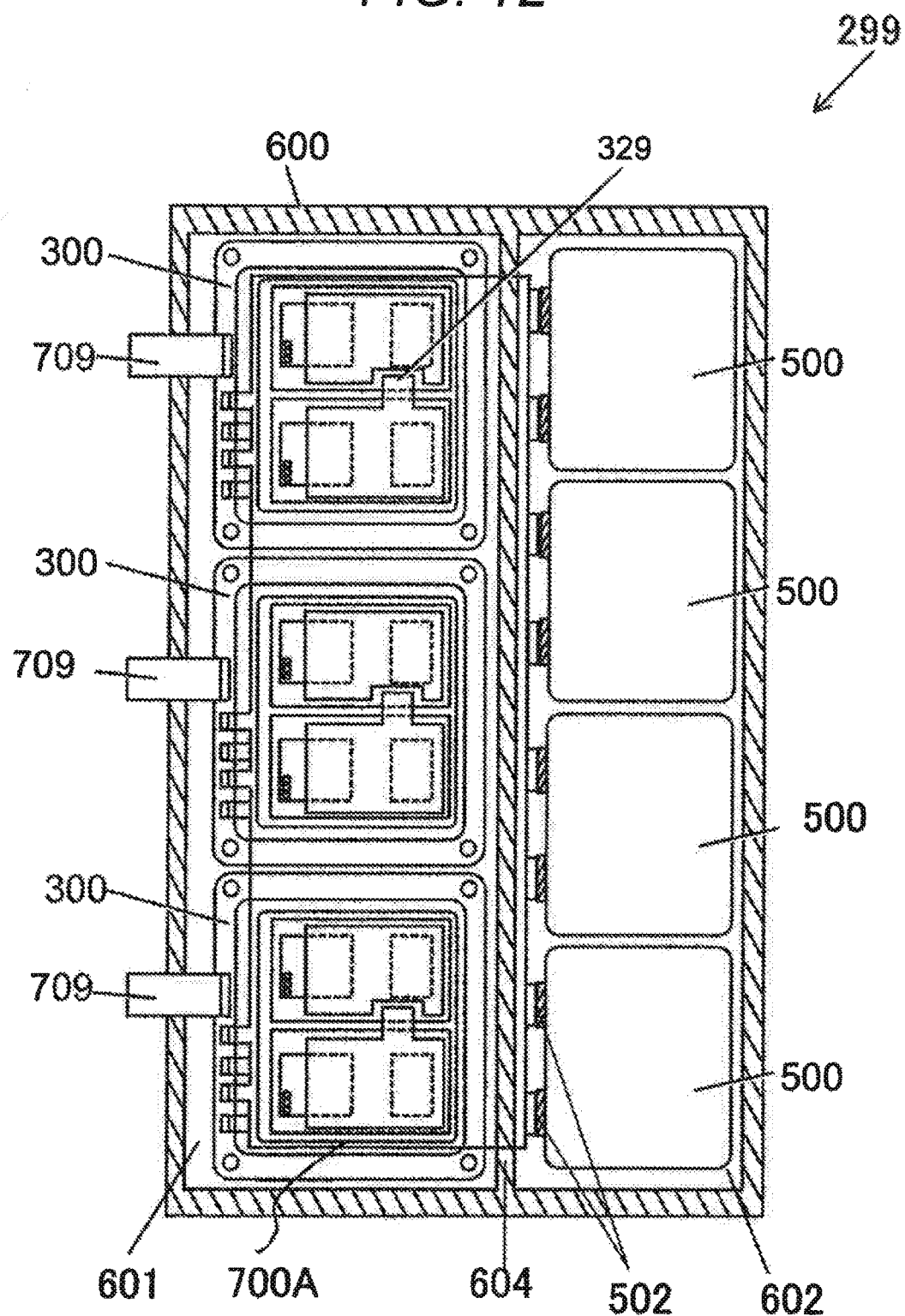
FIG. 12 is a plan view of the power conversion device shown in FIG. 11 as seen from the top.

FIG. 11 is a cross-sectional view of Embodiment 3 of the power conversion device according to the present invention, and FIG. 12 is a plan view as seen from the top of the power conversion device shown in FIG. 11. The power conversion device 299 of Embodiment 3 includes a control board 200. However, the control board 200 is omitted from illustration in FIG. 12. The water-cooled power conversion device 299 has a structure in which three power modules 300, four capacitors 500 and the control board 200 are accommodated in a housing 600. The housing 600 has a lower housing 600a and an upper housing 600b. The power modules 300 have substantially the same structure as the power module as the power conversion device 300 of Embodiment 1. However, in the water-cooled power conversion device 299 of Embodiment 3, one relay conductor portion 700; is provided commonly to the three power modules 300. The positive side bus bar 703 of the relay conductor portion 700A is connected to the positive DC terminal 315D (see FIG. 1) of each power module 300 and the positive side terminal 502 of each capacitor 500. Similarly, the negative side bus bar 704 of the relay conductor portion 700A is connected to the negative DC terminal 319D (see FIG. 1) of each power module 300 and the negative side terminal 502 of each capacitor 500. Each capacitor 500 corresponds to the capacitor 90 (see FIG. 7(B)) of Embodiment 1.

The positive/negative side bus bars 703 and 704 of the relay conductor portion 700A cover the entirety of the conductor plates 318 and 319 of the three power modules 300 and the intermediate connection portion 329. An AC bus bar 709 is connected to the AC terminal 320D of each power module 300 and led out to the outside from an opening formed in the housing 600.

The housing 600 has a power module accommodation portion 601 in which the three power modules 300 are accommodated, a capacitor accommodation portion 602 which accommodates the four capacitors 500, and a board accommodation portion 603 which accommodates the control board 200. The power module accommodation portion 601 is a space having a size to accommodate the three power modules 300, but basically has the same structure as the cooling housing 400 shown in FIG. 10. The power module accommodation portion 601 and the capacitor accommodation portion 602 are partitioned by a partition wall 604. Each of the four capacitors 500 is linearly disposed in the capacitor with accommodation portion 602, the positive/negative side terminals 502 facing the power module accommodation portion 601. The control board 200 is arranged on the partition wall 604. Although not shown, a boss portion supporting the control board 200 may be provided in the housing 600 in addition to the partition wall 604.

On the control board 200, a driver circuit for switching the IGBT of each power module 300 and electronic components such as a microcomputer which sends a command to the driver circuit are mounted. The driver circuit and the electronic components are provided on the upper face side of the control board 200, in other words, on the side opposite to the side facing the power modules 300 and the capacitors 500. In FIG. 12, although the control board 200 is not shown, the control board 200 covers and is arranged above the relay conductor portion 700A and the capacitors 500.

Since the power conversion device 299 of Embodiment 3 has a structure similar to that of Embodiment 1, the effects similar to the effects (1) to (5) of Embodiment 1 are exerted. In particular, the board accommodation portion 603 with a large area is provided above the power module accommodation portion 601 and the capacitor accommodation portion 602 to have a structure capable of accommodating the control board 200. The control board 200 is arranged in Parallel with the Power modules 300 and the capacitors 500. Therefore, it is possible to shorten the height of the power conversion device 299 having the housing 600 which incorporates the control board 200.

Embodiment 4

Figure 13:
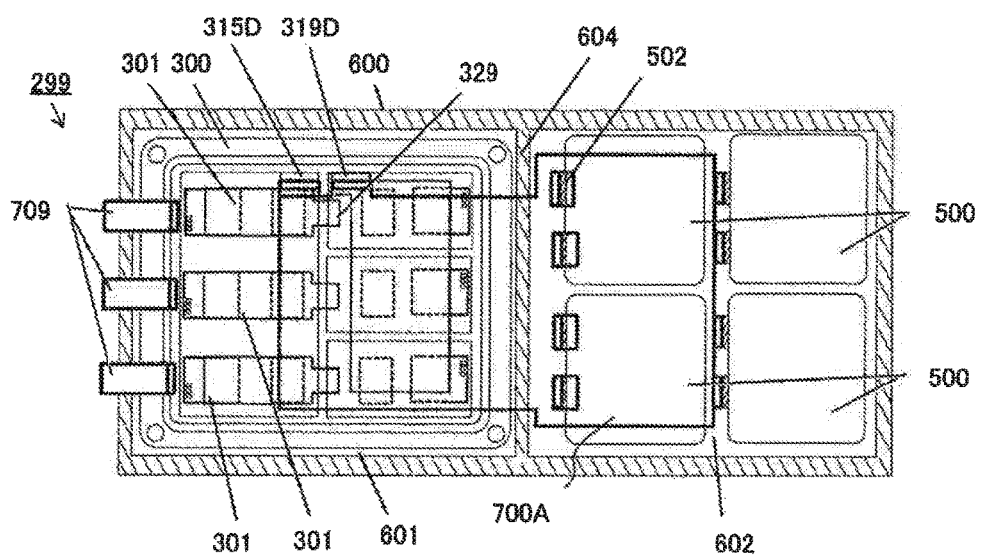
FIG. 13 is plan view showing Embodiment 4 of the power conversion device according to the present invention as seen from the top.

FIG. 13 is a plan view showing Embodiment 4 of the power conversion device according to the present invention as seen from the top. In the power conversion device 299 of Embodiment 4, the power module 300 has a 6 in 1 structure in which three phases of an inverter series circuit are incorporated. In other words, the power module 300 has a structure in which three phases of the upper and lower arm series circuits are integrated. Each upper arm circuit in which the IGBT 328 and the diode 156 is interposed between the conductor plates 315 and 318 and each lower arm circuit in which the IGBT 330 and the diode 166 are interposed between the conductor plates 320 and 319 are connected by the intermediate connection portion 329 in a state of being linearly disposed to constitute a power semiconductor module 301. The three power semiconductor modules 301 are sealed with the sealing resin 303 in a state of being disposed in parallel in the longitudinal direction. Thus, in the power modules 300 of Embodiment 4, the upper and lower arm series circuits serve as one power semiconductor module 301 (2 in 1), and the three power semiconductor modules 301 are integrated into a 6 in 1 structure.

Similarly to Embodiment 3, the housing 600 of Embodiment 4 has the power module accommodation portion 601 in which the three power modules 300 are accommodated, the capacitor accommodation portion 602 which accommodates the four capacitors 500, and the partition wall 604 which partitions the power module accommodation portion 601 and the capacitor accommodation portion 602. Moreover, although not shown, the board accommodation portion (corresponding to 603 in FIG. 11) which accommodates the control board 200 is provided above the power module accommodation portion 601 and the capacitor accommodation portion 602. The four capacitors 500 are disposed in two rows and accommodated in the capacitor accommodation portion 602. By disposing the capacitors 500 in two rows, the width of the power module accommodation portion 601 (the length in the disposition direction of the power semiconductor modules 301) and the width of the capacitor accommodation portion 602 can be made substantially equal.

The relay conductor portion 700A is arranged above the power modules 300 and the capacitors 500. One end of the relay conductor portion 700A extends to a position where the relay conductor portion 700A overlaps with a part of the upper arm circuit, that is, a part of the conductor plates 315 and 318. The other end of the relay conductor portion 700A covers the capacitor 500 in the first row and extends to a position corresponding to the positive/negative terminals 502 of the capacitors 500 in the second row. That is, the relay conductor portion 700A covers the entire intermediate connection portion 329, the entire lower arm circuits, and a part of the capacitors 500. Similarly to Embodiment 3, the positive/negative side bus bars 703 and 704 of the relay conductor portion 700A are connected to the positive/negative DC terminals 315D and 319D and are also connected to the positive/negative side terminals 502 each of the capacitors 500.

Although not shown in FIG. 13, the control board 200 is arranged above the relay conductor portion 700A, similarly to the power conversion device 299 shown in FIG. 11. Note that the AC bus bar 709 connected to the AC terminal 320D of each power semiconductor module 301 is led out to the outside of the housing 600 through an opening provided at one side of the housing 600.

FIG. 14(A) shows the current path of the power module shown in FIG. 13, and FIG. 14(B) shows the current path of the relay conductor portion shown in FIG. 13. As described above, in Embodiment 4, the upper arm circuit in which the IGBT 328 and the diode 156 are interposed between the conductor plates 315 and 318 and the lower arm circuit in which the IGBT 330 and the diode 166 are interposed between the conductor plates 320 and 319 are linearly disposed. However, the positive DC terminal 315D connected to the upper arm circuit and the negative DC terminal 319D connected to the lower arm circuit are arranged in a direction vertical to the upper and lower arm series circuits. Therefore, similarly to the case of Embodiment 1, the recovery current 100 generated during the switching flows through a loop-shaped path as shown in FIG. 14(A). Although not shown, this recovery current 100 causes an eddy current to flow through the housing 600. Moreover, as shown in FIG. 14(B), the eddy current 101 also flows through the positive side bus bar 703 of the relay conductor portion 700. The direction of the magnetic flux generated around the eddy current 101 generated at the housing 600 and the positive side bus bar 703 is opposite to the direction of the magnetic flux generated around the recovery current 100. Thus, the magnetic fluxes cancel each other, and the inductance of the internal circuit decreases.

The power conversion device 299 of Embodiment 4 has similar effects as those of Embodiment 3. In addition, by making the power module 300 to 6 in 1, more downsizing can be achieved as compared with Embodiment 3, and the floor area for the installation place can be reduced.

Embodiment 5

Figure 15:
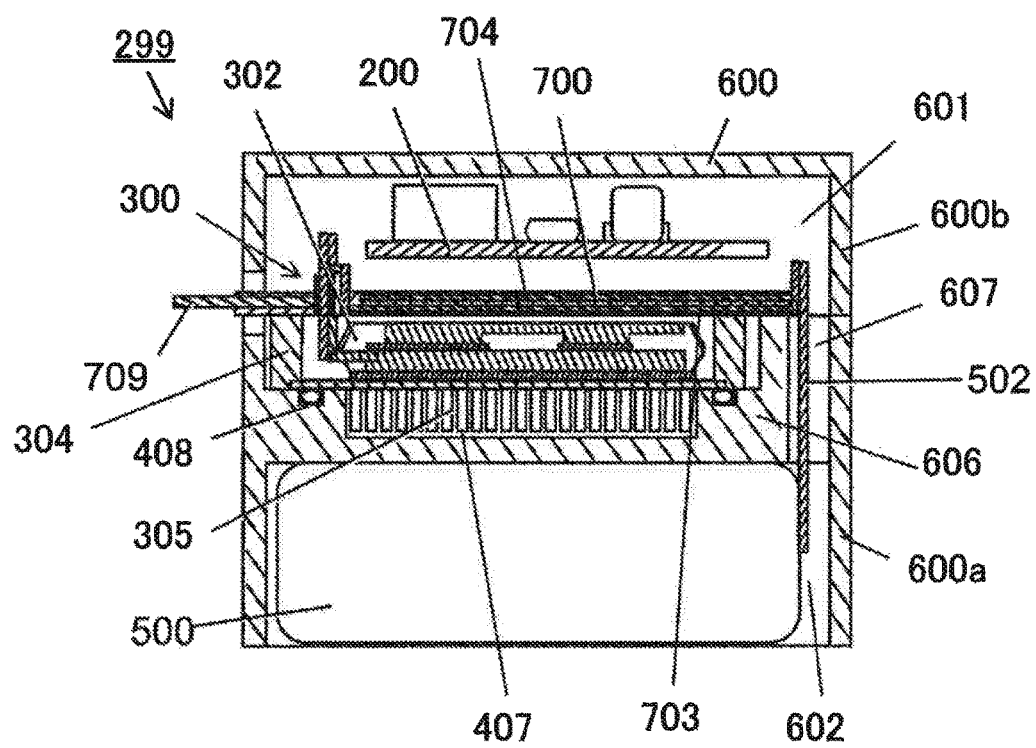
FIG. 15 is a cross-sectional view of Embodiment 5 of the power conversion device according to the present invention.

FIG. 15 is a cross-sectional view of Embodiment 5 of the power conversion device according to the present invention. The power conversion device 299 of Embodiment 5 has a structure in which the power module 300 and the capacitor 500 are stacked. The housing 600 has a lower housing 600a and an upper housing 600b. An intermediate step partition portion 606 is provided at an intermediate portion in the height direction of the housing 600. The intermediate step partition portion 606 is formed integrally with the lower housing 600a. An opening portion 607 which communicates the lower housing 600a and the upper housing 600b is formed at one end side of the intermediate step partition portion 606. The capacitor 500 is accommodated in the capacitor accommodation portion 602 formed below the intermediate step partition portion 606. The power module 300 is arranged in the power module accommodation portion 601 formed above the intermediate step partition portion 606. The cooling flow path 407 in which the fins 305 of the case 304 are accommodated is formed at the intermediate step partition portion 606.

The positive/negative side terminals 502 of each capacitor 500 are inserted through the opening portion 607 of the intermediate step partition portion 606 and introduced into the power module accommodation portion 601. Similarly to Embodiment 1, the relay conductor portion 700 is arranged on the circuit body 302. The positive/negative side bus bars 703 and 704 of the relay conductor portion 700 are connected to the positive/negative DC terminals 315D and 319D and to the positive/negative side terminals 502 of each capacitor 500.

The control board 200 is arranged above the power module 300. That is, the power module 300 and the control board 200 are accommodated in the power module accommodation portion 601.

Other constituents in Embodiment 5 are denoted by the same reference signs as the corresponding members in other Embodiments, and the descriptions thereof are omitted.

The power conversion device 299 of Embodiment 5 has effects similar to those of Embodiment 4. In particular, since the capacitor 500 and the power module 300 are stacked, it is possible to further reduce the floor space.

Note that the power module 300 may be 6 in 1 in Embodiment 5. The capacitors 500 may be stacked in two steps.

In each of Embodiments described above, the relay conductor portions 700 and 700A are exemplified as a structure in which the positive side bus bar 703 is arranged on the side facing the circuit body 302. However, the structure may be that the negative side bus bar 704 is arranged on the side facing the circuit body 302. That is, the negative side bus bar 704 may have a function of inducing the eddy current 101 which cancels the recovery current 100 of the circuit body 302.

Moreover, the AC bus bar connected to the AC, terminal 320D of the circuit body 302 may be the relay conductor portions 700 and 700A. The eddy current 101 which cancels the recovery current 100 is induced at the bus bar arranged close to the circuit body 302. Therefore, the relay conductor portions 700 and 700A can be structured to be any one of or integrate any combination of two or three of the positive side bus bar 703, the negative side bus bar 704 and the AC bus bar. However, it is necessary to insulate the positive/negative side bus bars 703 and 704 and the AC bus bar from each other.

Furthermore, in each of Embodiments described above, the orientation of the power modules 300 may be reversed upside down, that is, the case 304 is arranged so as to face one of the conductor plate 318 and the conductor plate 315 and one of the conductor plate 319 and the conductor plate 320, and the relay conductor plates 700 and 700 A are arranged so as to face at least one of the other of the conductor plate 318 and the conductor plate 315 and the other of the conductor plate and the conductor plate 320. In this way, the folding effect can be exerted in Embodiments described above.

It is also possible to combine the power conversion device 300 and 299 of Embodiments 1 to 5. Although various embodiments and modifications have been described above, the present invention is not limited to these contents. Other embodiments considered within the scope of the technical idea of the present invention are also included within the scope of the present invention.

REFERENCE SIGNS LIST 299 power conversion device
300 power conversion device (power module)
301 power semiconductor module
302 circuit body
304 case (metal member)
315 positive DC conductor plate (conductor portion.)
315D positive DC terminal (terminal)
319 negative DC conductor plate (conductor portion)
319D negative DC terminal (terminal)
318 second AC conductor plate (conductor portion)
320 first AC conductor plate (conductor portion)
3200 AC terminal (terminal)
328 330 IGBT (switching element)
400 cooling housing
500 capacitor
600 housing (metal member)
700, 700A relay conductor portion. (relay conductor member)
703 positive side bus bar (relay conductor plate)
704 negative side bus bar (relay conductor plate)
709 AC bus bar (relay conductor plate)
710 sealing resin (resin)

The invention claimed is:

1. A power conversion device, comprising:
a circuit body comprising: a first switching element which constitutes an upper arm circuit of a power conversion circuit; a second switching element which constitutes a lower arm circuit of the power conversion circuit; and a plurality of conductor portions which transmit an electric current to the first switching element and the second switching element;
a metal member; and
a relay conductor plate which is arranged to face the metal member with the circuit body interposed therebetween and is electrically connected to a terminal connected to any one of the conductor portions,
wherein an eddy current is induced at the metal member and the relay conductor plate by a recovery current flowing through the conductor portions according to switching operation of the first switching element or the second switching element, and
wherein the conductor portions comprises:
a first conductor plate and a second conductor plate which face each other with the first switching element interposed therebetween;
a third conductor plate and a fourth conductor plate which face each other with the second switching element interposed therebetween; and
an intermediate connection portion which connects the second conductor plate and the third conductor plate,
the metal member is arranged to face one of the first conductor plate and the second conductor plate, one of the third conductor plate and fourth conductor plate, and the intermediate connection portion, and
the relay conductor plate is arranged to face at least other of the first conductor plate or the second conductor plate.

2. The power conversion device according to claim 1, wherein the metal member comprises a heat dissipation member in contact with a coolant.

3. The power conversion device according to claim 1, wherein the relay conductor plate is arranged to further face other of the third conductor plate or the fourth conductor plate and the intermediate connection portion.

4. The power conversion device according to claim 1, further comprising a capacitor for smoothing a voltage, wherein the relay conductor plate is connected to the circuit body and the capacitor.

5. The power conversion device according to claim 4, wherein the terminal comprises a positive DC terminal and a negative DC terminal, and
the relay conductor plate comprises:
a positive bus bar connected to the positive DC terminal and the capacitor;
a negative bus bar connected to the negative DC terminal and the capacitor; and
a sealing resin which seals the positive bus bar and the negative bus bar in a state of being insulated from each other.

6. The power conversion device according claim 1, wherein the terminal comprises an AC terminal, and
the relay conductor plate is an AC bus bar connected to the AC terminal.

* * * * *